(12) United States Patent
Takahashi et al.

(10) Patent No.: US 9,691,630 B2
(45) Date of Patent: Jun. 27, 2017

(54) ETCHING METHOD

(71) Applicant: TOKYO ELECTRON LIMITED, Minato-ku, Tokyo (JP)

(72) Inventors: Nobuhiro Takahashi, Nirasaki (JP); Tetsuro Takahashi, Nirasaki (JP); Shuji Moriya, Nirasaki (JP); Masashi Matsumoto, Nirasaki (JP); Junichiro Matsunaga, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 14/784,962

(22) PCT Filed: Mar. 5, 2014

(86) PCT No.: PCT/JP2014/055614
§ 371 (c)(1),
(2) Date: Oct. 16, 2015

(87) PCT Pub. No.: WO2014/171214
PCT Pub. Date: Oct. 23, 2014

(65) Prior Publication Data
US 2016/0086814 A1 Mar. 24, 2016

(30) Foreign Application Priority Data

Apr. 19, 2013 (JP) ................. 2013-088207
Oct. 3, 2013 (JP) ................. 2013-208534

(51) Int. Cl.
*H01L 21/302* (2006.01)
*H01L 21/311* (2006.01)

(52) U.S. Cl.
CPC ............. *H01L 21/31116* (2013.01)

(58) Field of Classification Search
CPC ............. H01L 21/302; H01L 21/3083; H01L 21/3043; H01L 21/31144; H01L 21/31116;
(Continued)

(56) References Cited

U.S. PATENT DOCUMENTS

| | | | | |
|---|---|---|---|---|
| 5,786,276 | A | * | 7/1998 | Brooks ............ H01L 21/31116 257/E21.252 |
| 6,844,265 | B2 | * | 1/2005 | Ouchi ............... H01L 21/31116 216/67 |

(Continued)

FOREIGN PATENT DOCUMENTS

| | | |
|---|---|---|
| JP | 64-1236 A | 1/1989 |
| JP | 2003-309108 A | 10/2003 |

(Continued)

OTHER PUBLICATIONS

International Search Report of PCT/JP2014/055614 mailed Jun. 10, 2014, and its English Translation.

*Primary Examiner* — Lan Vinh
(74) *Attorney, Agent, or Firm* — Nath, Goldberg & Meyer; Jerald L. Meyer; Annie J. Kock

(57) ABSTRACT

An etching method includes loading a target substrate W into a chamber 40, the target substrate W having a silicon nitride film formed thereon and at least one of a polysilicon film and a silicon oxide film formed adjacent to the silicon nitride film; supplying a fluorine (F)-containing gas and an $O_2$ gas into the chamber 40, while at least the $O_2$ gas is excited; and selectively etching the silicon nitride film with respect to at least one of the polysilicon film and the silicon oxide film using the F-containing gas and the $O_2$ gas.

20 Claims, 10 Drawing Sheets

(58) Field of Classification Search
CPC ............ H01L 21/31138; H01L 21/3065; H01J 37/32357; H01J 37/32422
USPC ....... 438/706, 710, 712, 714, 717, 719, 720, 438/723, 725; 216/58, 63, 68, 74
See application file for complete search history.

(56) References Cited

U.S. PATENT DOCUMENTS

| | | | |
|---|---|---|---|
| 8,664,125 B2* | 3/2014 | Raley | H01J 37/32192 438/305 |
| 2005/0042876 A1* | 2/2005 | Kobayashi | H01L 21/76897 438/690 |
| 2005/0048782 A1* | 3/2005 | Vanhaelemeersch | H01L 21/31138 438/690 |
| 2007/0190792 A1* | 8/2007 | Cook | H01L 21/31116 438/706 |
| 2012/0238102 A1* | 9/2012 | Zhang | H01J 37/32422 438/718 |

FOREIGN PATENT DOCUMENTS

| | | |
|---|---|---|
| JP | 2005-039185 A | 2/2005 |
| JP | 2008-160000 A | 7/2008 |
| JP | 2008-291344 A | 12/2008 |
| JP | 2010-182730 A | 8/2010 |
| JP | 2011-171378 A | 9/2011 |
| JP | 2011-238733 A | 11/2011 |
| KR | 1020030081169 A | 10/2003 |
| KR | 100777043 B1 | 11/2007 |
| KR | 1020080104299 A | 12/2008 |
| WO | 2012/125656 A2 | 9/2012 |

* cited by examiner

ETCHING METHOD

CROSS-REFERENCE TO RELATED APPLICATION

This application is a Continuation Application of PCT International Application No. PCT/JP2014/055614, filed Mar. 5, 2014, which claimed the benefit of Japanese Patent Application Nos. 2013-088207 and 2013-208534, filed Apr. 19, 2013 and Oct. 3, 2013, respectively, the entire contents of which are hereby incorporated by reference

TECHNICAL FIELD

The present disclosure relates to an etching method of etching a film made of a predetermined material, which is formed on a substrate.

BACKGROUND

In recent years, in a semiconductor device manufacturing process, a dry etching technique called chemical oxide removal (COR) draws attentions as an alternative fine etching method for dry etching or wet etching. A hydrogen fluoride (HF) gas alone or a combination of the HF gas and an ammonia ($NH_3$) gas is used to etch an oxide such as a silicon oxide ($SiO_2$).

The COR process is a low-damage technique of etching the oxide without generating plasma within a chamber. For this reason, the COR process is recently under consideration as a way to etch a silicon nitride (SiN) film. As an etching gas used in etching the SiN film without generating plasma within the chamber, a combination of an HF gas and an F2 gas is under consideration.

However, in a semiconductor wafer, an SiN film is formed adjacent to silicon (Si) included in a polysilicon (poly-Si) film, an Si substrate or the like, or an $SiO_2$ film in many cases. In this situation, when the SiN film is etched with the combination of the HF gas and the $F_2$ gas, the $SiO_2$ film may be etched by the HF gas and an $NH_3$ gas generated as reaction products at a low temperature, while the poly-Si film may be etched at a high temperature. This causes a problem in that it is difficult to etch the SiN film with respect to the $SiO_2$ film and the poly-Si film with high selectivity.

Some embodiments of the present disclosure provide an etching method which is capable of etching a silicon nitride film with respect to at least one of a silicon oxide film and a polysilicon film with high selectivity, without generating plasma within a chamber.

SUMMARY

According to one embodiment of the present disclosure, there is provided an etching method including: loading a target substrate into a chamber, the target substrate having a silicon nitride film and at least one of a polysilicon film and a silicon oxide film formed adjacent to the silicon nitride film; supplying a fluorine (F)-containing gas and an $O_2$ gas, while exciting at least the $O_2$ gas, into the chamber; and selectively etching the silicon nitride film with respect to at least one of the polysilicon film and the silicon oxide film using the F-containing gas and the $O_2$ gas.

In one embodiment of the present disclosure, an inert gas may be further supplied in the etching. In some embodiments, an $N_2$ gas or an Ar gas may be as the inert gas.

In some embodiments, a combination of the F-containing gas and the $O_2$ gas may be excited by plasma outside the chamber and subsequently, be introduced into the chamber. Alternatively, the F-containing gas and the $O_2$ gas may be separately excited by plasma outside the chamber and subsequently, be separately introduced into the chamber. Alternatively, the F-containing gas, without exciting, may be introduced into the chamber, while the $O_2$ gas may be excited by plasma outside the chamber and subsequently, be introduced into the chamber.

In some embodiments, before the etching, a pre-oxidation process which supplies an oxygen plasma to the target substrate such that a surface of the target substrate is oxidized, may be performed.

In some embodiments, an $F_2$ gas diluted with an inert gas may be used as the F-containing gas in the etching. Further, in some embodiments, an $N_2$ gas or an Ar gas may be used as the inert gas. In this case, a volume ratio of the $O_2$ gas to the $F_2$ gas may range from 1:2 to 1:1,000.

In some embodiments, a $ClF_3$ gas may be used as the F-containing gas in the etching. In this case, a volume ratio of the $O_2$ gas to the $ClF_3$ gas may range from 1:4 to 1:1,000 in the etching.

In some embodiments, a temperature of a mounting table on which the target substrate is loaded within the chamber may range from 10 to 200 degrees C. in the etching. Further, in some embodiments, an internal pressure of the chamber may range from 13 to 1,333 Pa in the etching.

According to another embodiment of the present disclosure, there is provided a non-transitory computer-readable recording medium storing a program that operates on a computer and causes the computer to control an etching device, wherein the program causes, when executed, the computer to control the etching device to perform the aforementioned etching method.

According to the present disclosure, it is possible to etch an SiN film formed on a surface of a target substrate at a high etching rate and with high selectivity with respect to at least one of an $SiO_2$ film and a poly-Si film formed adjacent to the SiN film, without generating plasma within a chamber.

DETAILED DESCRIPTION

Embodiments of the present disclosure will now be described in detail with reference to the accompanying drawings.

<One Example of Processing System Used in Embodiment of the Present Disclosure>

Figure 1:
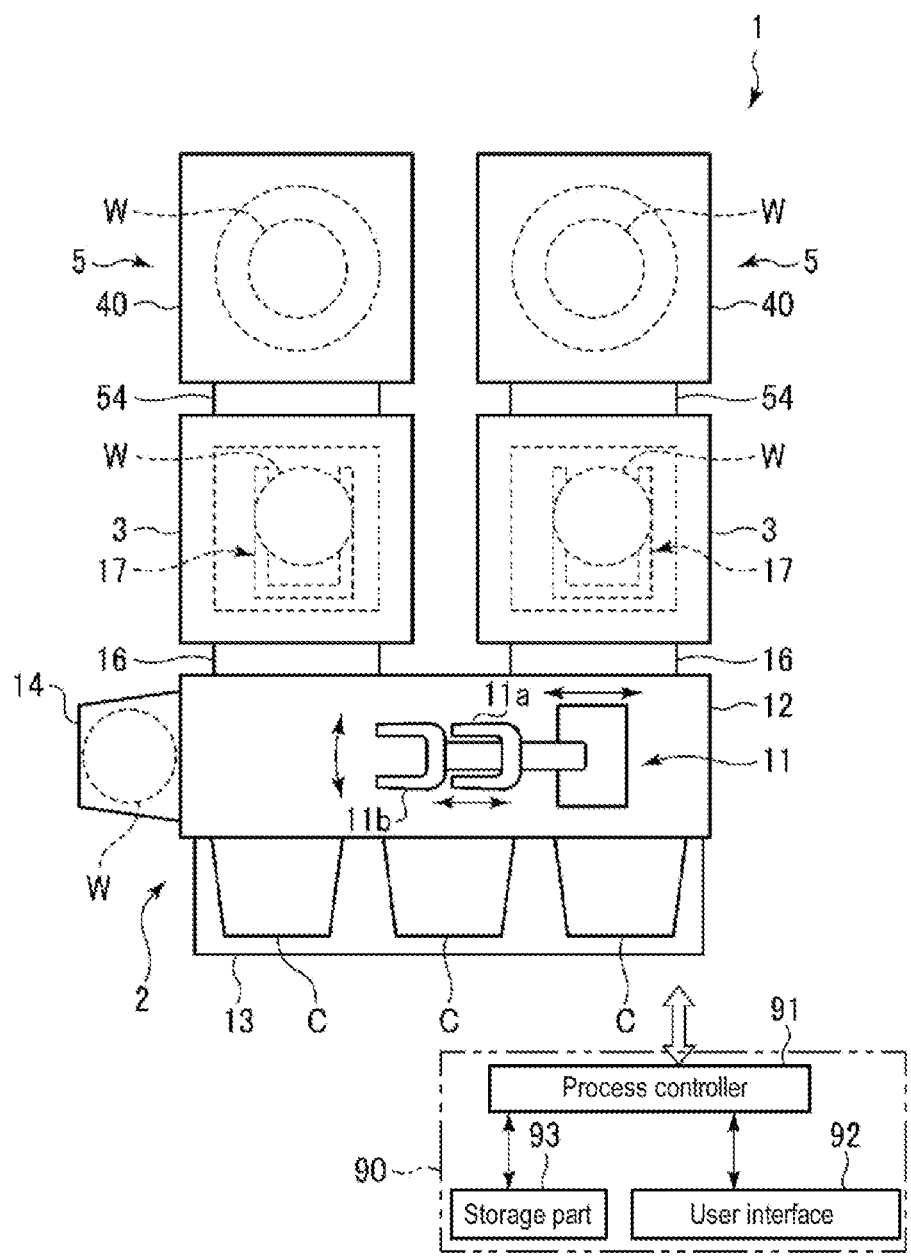
FIG. 1 is a schematic configuration view illustrating one example of a processing system including an etching device which is used to perform an etching method according to an embodiment of the present disclosure.

FIG. 1 is a schematic configuration view illustrating one example of a processing system including an etching device which is used in performing an etching method according to the present disclosure. The processing system 1 includes: a loading/unloading part 2 configured to load and unload a semiconductor wafer (hereinafter simply referred to as a "wafer") W; two load lock chambers 3 disposed adjacent to the loading/unloading part 2; two etching devices 5 disposed adjacent to the two load lock chambers 3 and configured to etch the wafer W without generating plasma.

The loading/unloading part 2 includes a transfer chamber 12 within which a first wafer transfer mechanism 11 for transferring the wafer W is installed. The first wafer transfer mechanism 11 includes two transfer arms 11a and 11b configured to hold the wafer W in a substantially horizontal posture. A mounting stage 13 is installed at one longitudinal side of the transfer chamber 12. The mounting stage 13 is configured to mount a plurality of (e.g., three) carriers C each of which being capable of accommodating plural sheets of the wafers W, respectively. In addition, an orienter 14 configured to perform a position alignment of the wafer W by rotating the wafer W and finding an eccentric amount thereof is installed adjacent to the transfer chamber 12.

In the loading/unloading part 2, the wafer W is held by the transfer arms 11a or 11b and is moved linearly within a substantially horizontal plane or moved up and down by the operation of the first wafer transfer mechanism 11 such that the wafer W is transferred to a desired position. Further, as the transfer arms 11a and 11b move toward or away from the respective carrier C, the orienter 14 and the respective load lock chambers 3, the wafer W is loaded into or unloaded from the respective carrier C mounted on the mounting stage 13, the orienter 14 and the respective load lock chamber 3.

Each of the load lock chambers 3 is coupled to the transfer chamber 12 with a gate valve 16 interposed between each of the load lock chambers 3 and the transfer chamber 12. Each of the load lock chambers 3 includes a second wafer transfer mechanism 17 for transferring the wafer W. Each of the load lock chambers 3 is configured such that it can be evacuated to a predetermined vacuum degree.

The second wafer transfer mechanism 17 includes a peak configured to hold the wafer W in a substantially horizontal posture. The peak of the second wafer transfer mechanism 17 is moved between the load lock chamber 3 and the etching device 5 such that the wafer W is transferred between the load lock chamber 3 and the etching device 5.

The processing system 1 includes a control part 90. The control part 90 includes a process controller 91 provided with a microprocessor (computer) which controls respective components of the processing system 1. The process controller 91 is connected to a user interface 92 which includes a keyboard that allows an operator to perform a command input operation or the like in order to manage the processing system 1, a display that visually displays an operation status of the processing system 1, and the like. Further, the process controller 91 is connected to a storage part 93 which stores: control programs for realizing, under the control of the process controller 91, various types of processes performed in the processing system 1, for example, supply of a process gas and evacuation of the interior of the chamber in the etching device 5 (which will be described later); process recipes which are control programs for allowing the respective components of the processing system 1 to perform specified processes according to process conditions; and various types of databases. The process recipes are stored in a suitable storage medium (not shown) of the storage part 93. If necessary, an arbitrary recipe is called out from the storage part 93 and is executed by the process controller 91. In this way, desired processes are performed in the processing system 1 under the control of the process controller 91.

A specific configuration of the etching device 5 will be described in detail later.

In the processing system 1 configured as above, a wafer having an SiN film as an etching target formed on a surface thereof and at least one of an $SiO_2$ film and a poly-Si film formed adjacent to the SiN film is used as the wafer W. A plurality of wafers W of this type is accommodated within the carrier C and is transferred to the processing system 1. In the processing system 1, one of the wafers W is transferred from one of the carriers C mounted in the loading/unloading part 2 into one of the load lock chambers 3 by one of the transfer arms 11a and 11b of the first wafer transfer mechanism 11 while keeping the atmosphere-side gate valve 16 open, and is delivered to the pick of the second wafer transfer mechanism 17 installed in the respective load lock chamber 3.

Thereafter, the atmosphere-side gate valve 16 is closed and the interior of the load lock chamber 3 is evacuated. Subsequently, the gate valve 54 is opened and the pick is extended into the respective etching device 5 such that the wafer W is transferred to the etching device 5.

Subsequently, the pick is returned to the load lock chamber 3 and the gate valve 54 is closed. Then, an etching process is performed within the etching device 5.

After the etching process of the etching device 5 is completed, the gate valve 54 is opened. The etched wafer W mounted on a mounting table 42 (see FIG. 2) is moved to the load lock chamber 3 by the pick of the second wafer transfer mechanism 17. Then, the etched wafer W is returned to the respective carrier C by one of the transfer arms 11a and 11b of the first wafer transfer mechanism 11. Thus, the etching process for one sheet of the wafer W is completed.

<Etching Device and Etching Method>

Figure 2:
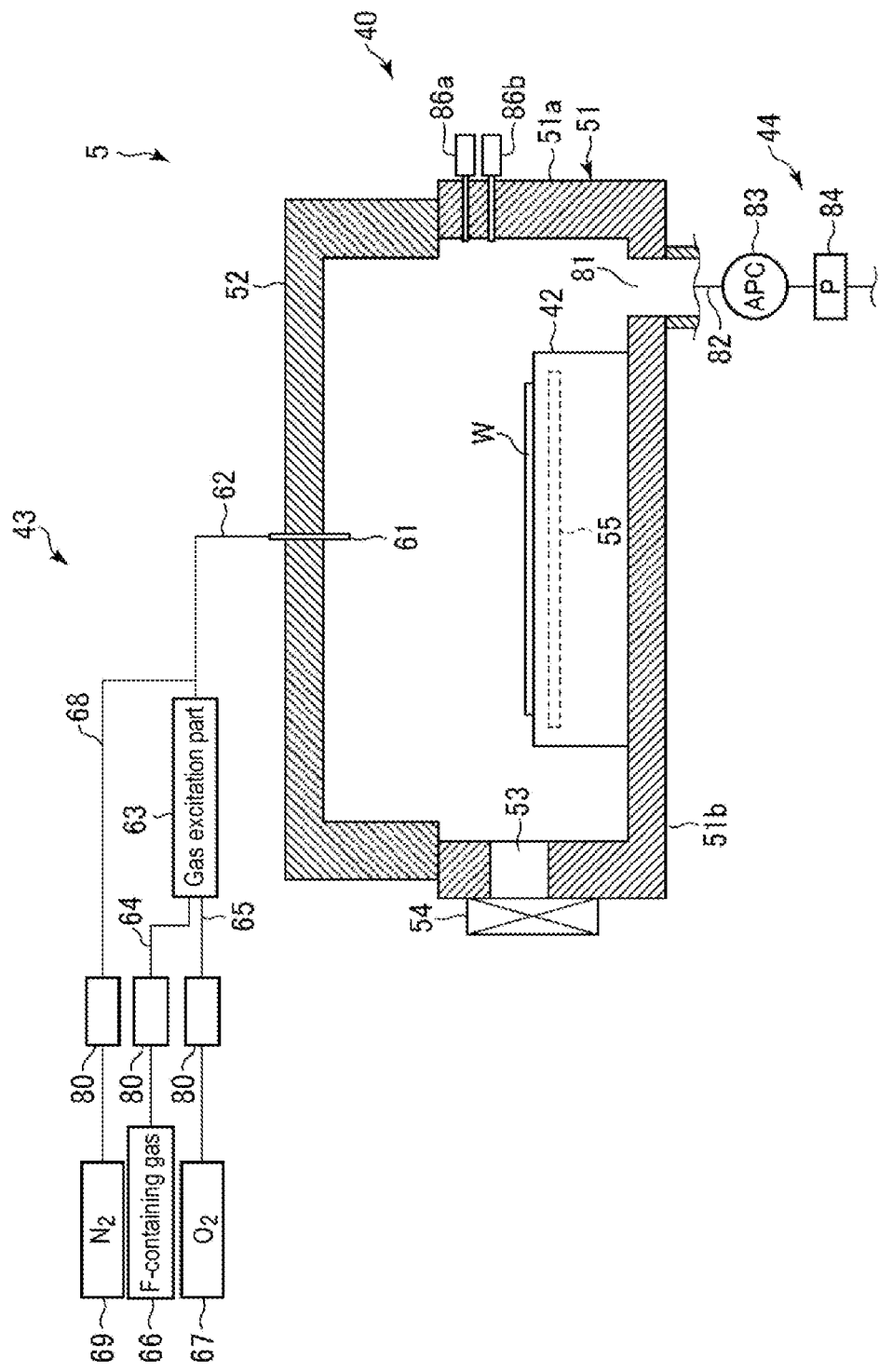
FIG. 2 is a cross-sectional view illustrating a schematic configuration of an etching device according to one embodiment, included in the processing system of FIG. 1.

Next, the etching device 5 and an etching method thereof will be described. FIG. 2 is a cross-sectional view illustrating a configuration of the etching device 5 according to one embodiment. As illustrated in FIG. 2, the etching device 5 includes a sealable chamber 40. The mounting table 42 configured to mount the wafer W thereon in a substantially horizontal posture is installed inside the chamber 40. In addition, the etching device 5 includes a gas supply mechanism 43 configured to supply an F-containing gas, an $O_2$ gas and the like into the chamber 40, and an exhaust mechanism 44 configured to exhaust the interior of the chamber 40.

The chamber 40 includes a chamber body 51 and a cover part 52. The chamber body 51 includes a substantially cylindrical sidewall portion 51a and a bottom portion 51b. An upper portion of the chamber body 51 is opened. This opening is closed by the cover part 52. The sidewall portion 51a and the cover part 52 are sealed by a seal member (not shown) such that an air-tightness of the interior of the chamber 40 is secured. A gas introduction nozzle 61 is installed to be inserted through a ceiling wall of the cover part 52 and to be extended from above toward the interior of the chamber 40.

A loading/unloading gate 53 through which the wafer W is transferred between the chamber 40 of the etching device 5 and the load lock chamber 3 is installed in the sidewall portion 51a. The loading/unloading gate 53 is opened and closed by the gate valve 54.

The mounting table 42 has a substantially circular shape when viewed from the top, and is fixed to the bottom portion 51b of the chamber 40. A temperature controller 55 configured to control a temperature of the mounting table 42 is installed within the mounting table 42. The temperature controller 55 includes a pipe line through which a temperature control medium (e.g., water, etc.) circulates. By heat exchange between the mounting table 42 and the temperature control medium flowing through the pipe line, the temperature of the mounting table 42 is controlled and hence a temperature of the wafer W mounted on the mounting table 42 is controlled.

The gas supply mechanism 43 includes a first gas supply pipe 62 connected to the gas introduction nozzle 61. The first gas supply pipe 62 is connected to a gas excitation part 63 configured to excite a gas by plasma. The gas excitation part 63 is connected to a second gas supply pipe 64 and a third gas supply pipe 65. The second gas supply pipe 64 is connected to an F-containing gas supply source 66 and the third gas supply pipe 65 is connected to an $O_2$ gas supply source 67. The first gas supply pipe 62 is connected to a fourth gas supply pipe 68 which is connected to an $N_2$ gas supply source 69 configured to supply an $N_2$ gas.

The F-containing gas supply source 66 supplies a fluorine (F)-containing gas. An example of the F-containing gas may include a high-level reaction gas, e.g., an $F_2$ gas or a $ClF_3$ gas.

When the $F_2$ gas is used as the F-containing gas, since the $F_2$ gas has a very high activity rate, a gas cylinder ordinarily used as the F-containing gas supply source 66 dilutes the $F_2$ gas with an inert gas (typically, an $N_2$ gas) at a volume ratio of the $F_2$ gas to the $N_2$ gas equal to 1:4. As such, when the $F_2$ gas is used as the F-containing gas, the inert gas is inevitably included in an etching gas.

Meanwhile, when the $ClF_3$ gas is used as the F-containing gas, the inert gas may not be included in the etching gas.

In either case, the F-containing gas can be further diluted with the $N_2$ gas supplied from the $N_2$ gas supply source 69.

Flow rate controllers 80 configured to perform an opening and closing operation of a flow channel and a control operation of a flow rate are installed in the second to fourth gas supply pipes 64, 65, and 68, respectively. Each of the flow rate controllers 80 includes, for example, an on-off valve and a mass flow controller.

In the gas supply mechanism 43 configured as above, the F-containing gas supplied from the F-containing gas supply source 66 and the $O_2$ gas supplied from the $O_2$ gas supply source 67 are excited by plasma in the gas excitation part 63. These excited gases are diluted with the $N_2$ gas supplied from the $N_2$ gas supply source 69 as necessary and are introduced into the chamber 40 through a series of the first gas supply pipe 62 and the gas introduction nozzle 61. Further, the $N_2$ gas supplied from the $N_2$ gas supply source 69 may be used as a purge gas.

In some embodiments, when the F-containing gas supplied from the F-containing gas supply source 66 is the $F_2$ gas, a gas other than the $N_2$ gas may be used as the inert gas for diluting the $F_2$ gas. As an example, an Ar gas may be used as the inert gas. In some embodiments, a supply source of the other inert gas may be employed instead of the $N_2$ gas supply source 69. That is to say, in the etching process, gases supplied from the gas supply mechanism 43 are the F-containing gas and the $O_2$ gas. When the F-containing gas is the $F_2$ gas, the inert gas is additionally supplied. An example of the inert gas may include the $N_2$ gas or the Ar gas. When the F-containing gas is the $ClF_3$ gas, the inert gas is supplied as necessary.

A configuration of the gas excitation part 63 is not particularly limited as long as it can excite a gas by plasma. In some embodiments, the gas excitation part 63 may be configured to excite a gas at a position adjacent to the chamber 40 such that the excited gas is introduced into the chamber 40 through a hole formed in a wall portion (e.g., a ceiling wall) that defines the chamber 40.

The evacuation mechanism 44 includes an exhaust pipe 82 which is connected to an exhaust port 81 formed in the bottom portion 51b of the chamber 40. Further, the evacuation mechanism 44 includes an automatic pressure control valve (APC) 83 configured to control an internal pressure of the chamber 40 and a vacuum pump 84 configured to evacuate the interior of the chamber 40, which are installed in the exhaust pipe 82.

In the sidewall of the chamber 40, two capacitance manometers 86a and 86b as pressure gauges configured to measure the internal pressure of the chamber 40 are installed to be inserted into the chamber 40. The capacitance manometer 86a is used to measure a high pressure while the capacitance manometer 86b is used to measure a low pressure. A temperature sensor (not shown) configured to detect the temperature of the wafer W is installed near the wafer W mounted on the mounting table 42.

Aluminum (Al) is used as the material of the respective components such as the chamber 40 and the mounting table 42, which constitute the etching device 5. The aluminum material which constitutes the chamber 40 may be a pure aluminum material or an aluminum material having an anodized inner surface (the inner surface of the chamber body 51, etc.). On the other hand, a surface of the aluminum material which constitutes the mounting table 42 requires wear resistance. Therefore, an oxide film ($Al_2O_3$ film) having high wear resistance may be in some embodiments formed on the surface of the aluminum material by anodizing the aluminum material.

Next, a description will be made on an etching method using the etching device 5 configured as above. In this embodiment, while keeping the gate valve 54 open, the wafer W configured as above is loaded into the chamber 40 through the loading/unloading gate 53 by the pick of the second wafer transfer mechanism 17 disposed within the load lock chamber 3. Then, the wafer W is mounted on the mounting table 42.

Thereafter, the pick is returned to the load lock chamber 3. The gate valve 54 is closed to keep the interior of the chamber 40 in a sealed state.

In such a state, a pre-oxidation process is first performed using an oxygen plasma as necessary. The pre-oxidation process includes: adjusting a temperature of the mounting table 42 to a predetermined temperature by the temperature controller 55; exciting the $O_2$ gas supplied from the $O_2$ gas supply source 67 of the gas supply mechanism 43 in the gas excitation part 63 to generate plasma; and introducing the generated oxygen plasma into the chamber 40 through the first gas supply pipe 62 and the gas introduction nozzle 61.

The pre-oxidation process based on the oxygen plasma forms a $SiO_2$ film on a surface of the poly-Si film to protect the surface of the polysilicon film from etching, and oxides a surface of a SiN film (i.e., forms a SiNO film) to facilitate the etching. The pre-oxidation process modifies the surface of the wafer W, which makes it possible to further increase an etching rate of the SiN film and an etching selectivity of the SiN film to at least one of the poly-Si film and the $SiO_2$ film in a subsequent etching process.

In some embodiments, the internal pressure of the chamber 40 in the etching process may range from 13 to 1,333 Pa (0.1 to 10 Torr), and the temperature of the mounting table 42 may range from 10 to 200 degrees C. In addition, while an effect is increased with an increase in a process time, in terms of throughput, the process time may be 180 sec.

In some embodiments, the pre-oxidation process may be performed in another chamber which is separated from the chamber 40 of the etching device 5.

After the modification process is performed if necessary, the F-containing gas and the $O_2$ gas which are excited by plasma are introduced into the chamber 40 such that the SiN film is selectively etched. Specifically, the temperature of the mounting table 42 is adjusted to fall within a predetermined range by the temperature controller 55 and the internal pressure of the chamber 40 is also adjusted to fall within a predetermined range. The F-containing gas of a predetermined amount is supplied from the F-containing gas supply source 66 of the gas supply mechanism 43 to the gas excitation part 63 through the second gas supply pipe 64. The $O_2$ gas of a predetermined amount is supplied from the $O_2$ gas supply source 67 to the gas excitation part 63 through the third gas supply pipe 65. The F-containing gas and the $O_2$ gas are supplied to the gas excitation part 63 while keeping a predetermined ratio. Subsequently, the F-containing gas and the $O_2$ gas are excited by plasma in the gas excitation part 63. The excited gases are diluted with the $N_2$ gas if necessary, and subsequently, are introduced into the chamber 40 through the first gas supply pipe 62 and the gas introduction nozzle 61 such that the SiN film is subjected to the etching process. Other inert gas such as an Ar gas may be used instead of the $N_2$ gas.

By performing the etching process in this manner, the F-containing gas and the $O_2$ gas which are excited act on the SiN film, thus etching the SiN film at a high etching rate. At this time, etching rates of the poly-Si film and the $SiO_2$ film are lowered by the F-containing gas and the $O_2$ gas, which makes it possible to etch the SiN film with respect to the poly-Si film and the $SiO_2$ film with high selectivity. Further, when the $SiO_2$ film is used as an underlayer, the SiN film can be etched without causing damage such as roughness to the $SiO_2$ film.

As described above, the $F_2$ gas or the $ClF_3$ gas may be used as the F-containing gas. Further, as described above, when the $F_2$ gas is used as the F-containing gas, the gas cylinder ordinarily used as the F-containing gas supply source 66 dilutes the $F_2$ gas with the inert gas (typically, the $N_2$ gas) at a volume ratio of the $F_2$ gas to the $N_2$ gas equal to 1:4. As such, the inert gas is inevitably included in the etching gas.

In the etching process, the internal pressure of the chamber 40 may range from 13 to 1,333 Pa (0.1 to 10 Torr). Alternatively, the internal pressure of the chamber 40 may range from 66 to 666 Pa (0.5 to 5 Torr), and in some embodiments, may range from 133 to 333 Pa (1 to 2.5 Torr). Further, the temperature of the mounting table 42 (corresponding substantially to the temperature of the wafer) may be set to a low temperature (e.g., 35 degrees C. or lower) at which a good etching characteristic is obtained. However, when the temperature of the mounting table 42 exceeds 200 degrees C., the etching characteristic is lowered. Thus, the temperature of the mounting table 42 may range from 10 to 200 degrees C., and in some embodiments, 10 to 100 degrees C. Further, in some embodiments, the temperature of the mounting table 42 may range from 15 to 55 degrees C.

When the $F_2$ gas diluted with the inert gas such as the $N_2$ gas is used as the F-containing gas, a volume ratio of the $F_2$ gas to the $O_2$ gas may range from 1:2 to 1:1,000, and in some embodiments, 1:4 to 1:200. A gas flow rate may be significantly different depending on a target substrate. In some embodiments, the total flow rate of the $F_2$ gas and the $O_2$ gas may range from 100 to 5,000 mL/min (sccm), and a flow rate of the inert gas may range from 10 to 2,000 mL/min (sccm).

When the $ClF_3$ gas is used as the F-containing gas, in some embodiments, a volume ratio of the $ClF_3$ gas and the $O_2$ gas may range from 1:4 to 1:1,000, and alternatively, 1:10 to 1:300. A gas flow rate may be significantly different depending on a target substrate. In some embodiments, the total flow rate of the $ClF_3$ gas and the $O_2$ gas may range from 100 to 5,000 mL/min (sccm). When the inert gas is introduced, the total flow rate of the $ClF_3$ gas and the $O_2$ gas may range from 10 to 2,000 mL/min (sccm).

As described above, by performing the etching process based on the excited gases under an optimal condition, it is possible to realize an etching rate of the SiN film equal to 8 nm/min or higher and realize an etching selectivity of the SiN film to the poly-Si film and the $SiO_2$ film equal to 40 or greater.

After the etching process in the etching device 5 is completed in this way, the gate valve 54 is opened. The etched wafer W mounted on the mounting table 42 is unloaded from the chamber 40 by the pick of the second wafer transfer mechanism 17. Consequently, the etching process of the etching device 5 is terminated.

In addition, the foregoing pre-oxidation process is an arbitrary process performed as necessary. The pre-oxidation process is particularly effective when the F-containing gas is the $ClF_3$ gas.

<Other Embodiments of Etching Device>

Figure 3:
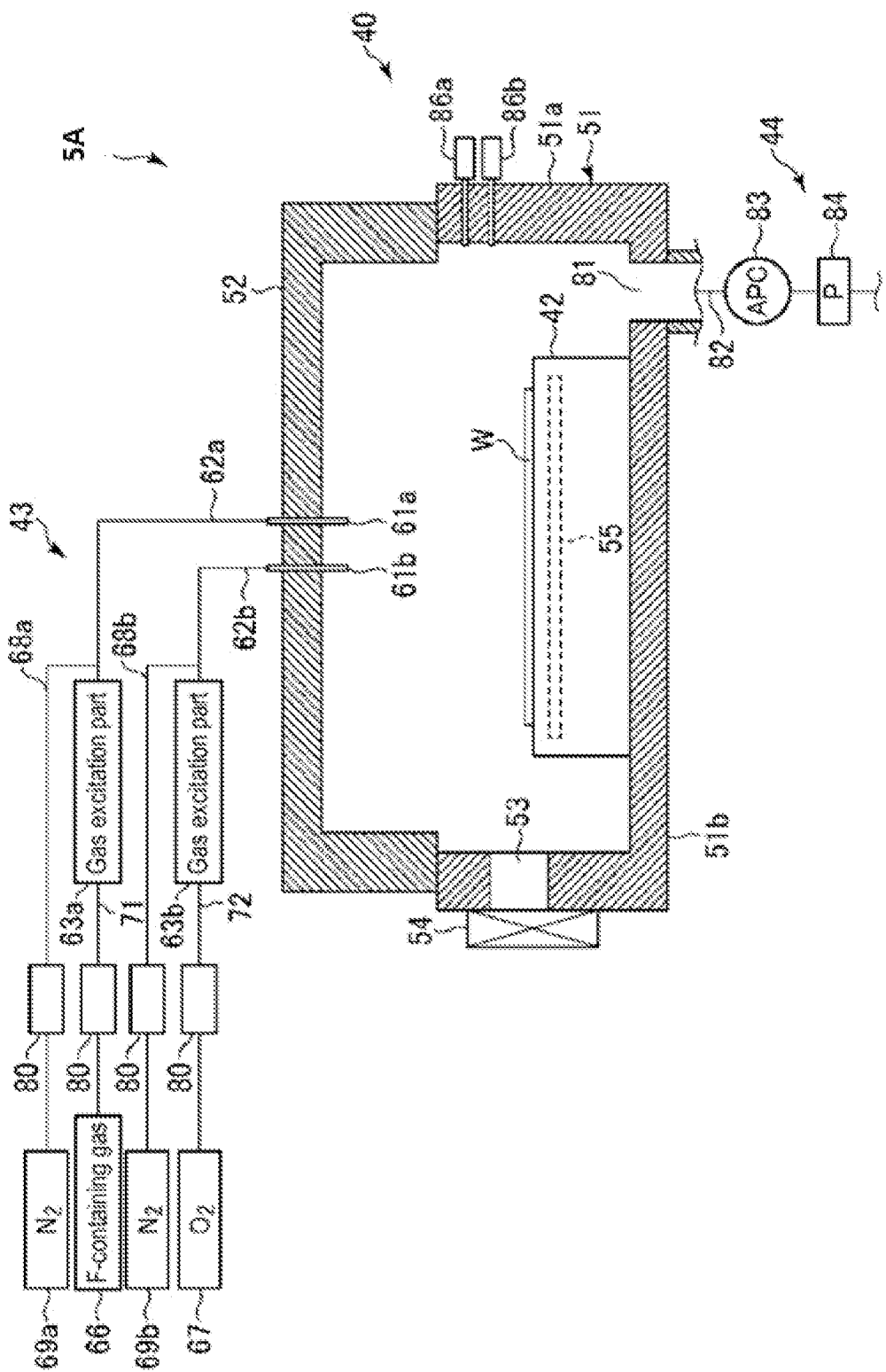
FIG. 3 is a cross-sectional view illustrating a schematic configuration of an etching device according to another embodiment, included in the processing system of FIG. 1.
Figure 4:
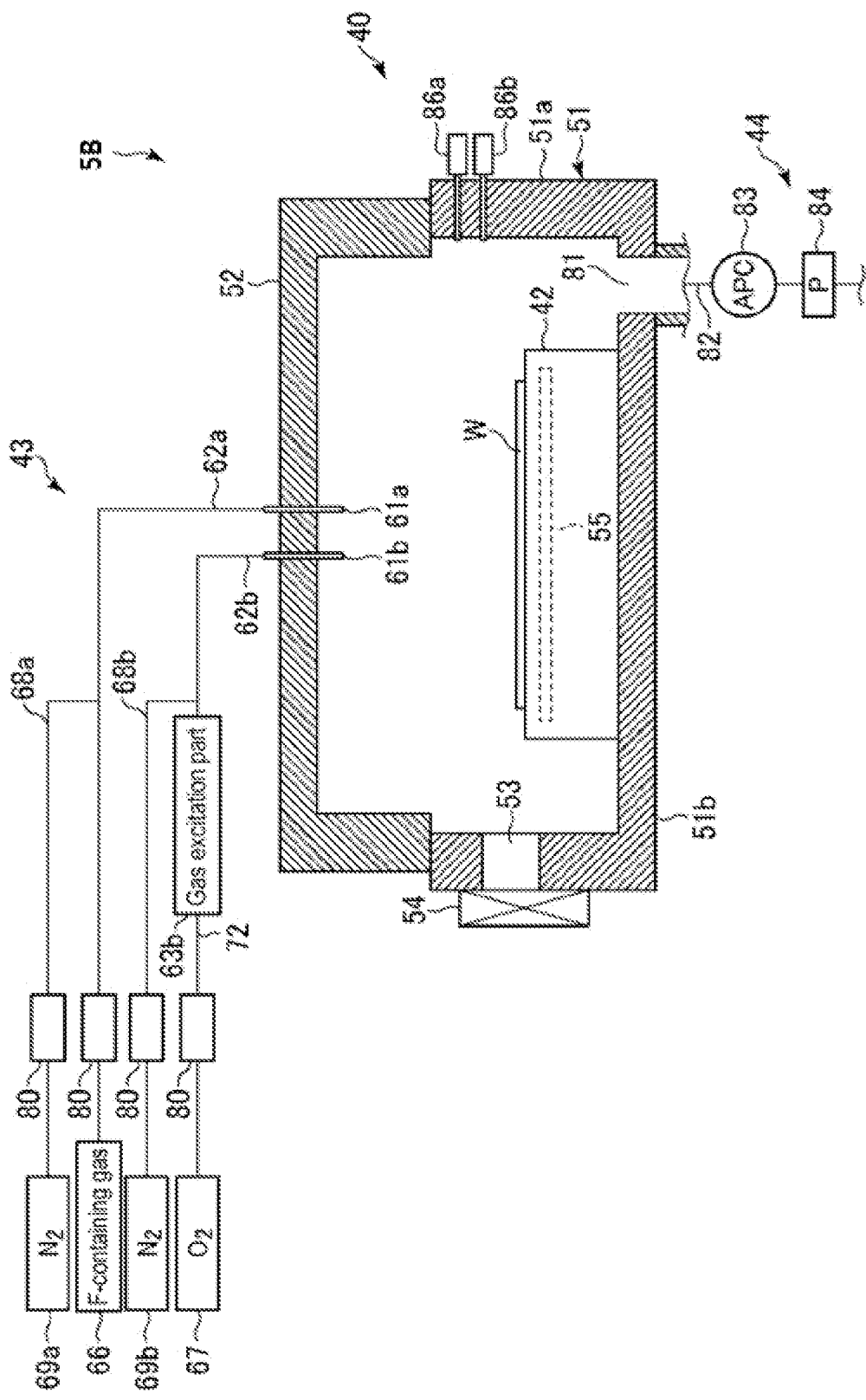
FIG. 4 is a cross-sectional view illustrating a schematic configuration of an etching device according to yet another embodiment, included in the processing system of FIG. 1.

While the foregoing is typical embodiments, the etching device may be provided to have configurations as illustrated in FIG. 3 and FIG. 4.

In another embodiment shown in FIG. 3, the F-containing gas and the $O_2$ gas are separately excited. In an etching device 5A of FIG. 3, a first gas introduction nozzle 61a and a second gas introduction nozzle 61b are installed to be inserted into the interior of the chamber 40 from above through a ceiling wall of the cover part 52 of the chamber 40. Further, the gas supply mechanism 43 includes a first gas supply pipe 62a and a second gas supply pipe 62b which are respectively connected to the first gas introduction nozzle 61a and the second gas introduction nozzle 61b. The first gas supply pipe 62a is connected to a first gas excitation part 63a, and the second gas supply pipe 62b is connected to a second gas excitation part 63b. The gas excitation parts 63a and 63b are configured to excite a gas by plasma, like the gas excitation part 63 of the first embodiment. In addition, the first gas excitation part 63a is connected to a third gas supply pipe 71 which is connected to the F-containing gas supply source 66. Meanwhile, the second gas excitation part 63b is connected to a fourth gas supply pipe 72 which is connected to the $O_2$ gas supply source 67. The first gas supply pipe 62a is connected to a fifth gas supply pipe 68a which is connected to a first $N_2$ gas supply source 69a configured to supply an $N_2$ gas. The second gas supply pipe 62b is connected to a sixth gas supply pipe 68b which is connected to a second $N_2$ gas supply source 69b configured to supply the $N_2$ gas.

Flow rate controllers 80 configured to perform an opening and closing operation of a flow channel and a control operation of a flow rate are installed in the third to sixth gas supply pipes 71, 72, 68a, and 68b, respectively. Each of the flow rate controllers 80 includes, for example, an on-off valve and a mass flow controller.

In the gas supply mechanism 43 of this embodiment, the F-containing gas and the $O_2$ gas are separately excited by plasma in the first gas excitation part 63a and the second gas excitation part 63b, respectively. The excited gases, while being diluted with the $N_2$ gas as necessary, are introduced into the chamber 40 from the first gas introduction nozzle 61a and the second gas introduction nozzle 61b through the first gas supply pipe 62a and the second gas supply pipe 62b, respectively.

The $N_2$ gas supplied from each of the first $N_2$ gas supply source 69a and the second $N_2$ gas supply source 69b may be used as a purge gas. In some embodiments, another inert gas supply source may be provided instead of the first and second $N_2$ gas supply sources 69a and 69b. In some embodiments, an Ar gas may be used as the inert gas.

Further, a configuration of each of the first and second gas excitation parts 63a and 63b is not particularly limited as long as they can excite a gas by plasma. Further, in some embodiments, the first and second gas excitation parts 63a and 63b may be configured to excite a gas at a position adjacent to the chamber 40 such that the excited gases are introduced into the chamber 40 through a hole formed on a wall portion (e.g., a ceiling wall) that defines the chamber 40.

An etching process using the etching device 5A configured as shown in FIG. 3 includes loading the wafer W into the chamber 40, mounting the wafer W on the mounting table 42, introducing the F-containing gas and the $O_2$ gas which are excited by plasma into the chamber 40, and selectively etching the SiN film. Specifically, the temperature of the mounting table 42 is adjusted to fall within a predetermined range by the temperature controller 55 and the internal pressure of the chamber 40 is adjusted to fall within a predetermined range. Subsequently, the F-containing gas supply source 66 of the gas supply mechanism 43 supplies the F-containing gas at a predetermined flow rate to the first gas excitation part 63a through the third gas supply pipe 71. The $O_2$ gas supply source 67 supplies the $O_2$ gas at a predetermined flow rate to the second gas excitation part 63b through the fourth gas supply pipe 72. The F-containing gas and the $O_2$ gas are excited by plasma in the first gas excitation part 63a and the second gas excitation part 63b, respectively. The excited gases are diluted with the $N_2$ gas if necessary. The diluted F-containing gas is introduced into the chamber 40 from the first gas introduction nozzle 61a through the first gas supply pipe 62a. Also, the diluted $O_2$ gas is introduced into the chamber 40 from the second gas introduction nozzle 61b through the second gas supply pipe 62b. Thus, the SiN film within the chamber 40 is selectively etched.

By performing the etching process in this manner, the F-containing gas and the $O_2$ gas act on the SiN film such that the SiN film can be etched at a high etching rate, like the etching device 5 of FIG. 2. Also, like the etching device 5 of FIG. 2, it is possible to decrease an etching rate of the poly-Si film and the $SiO_2$ film based on the F-containing gas and the $O_2$ gas, thus etching the SiN film with respect to the poly-Si film and the $SiO_2$ film with high selectivity. Further, when the $SiO_2$ film is used as an underlayer, it is possible to etch the SiN film without causing damage such as roughness to the $SiO_2$ film. An optimal condition applied at this time is similar to that of the etching device 5 of FIG. 2. In addition, by performing the etching process in this manner, it is possible to realize an etching rate of the SiN film equal to 8 nm/min or higher and realize an etching selectivity of the SiN film to the poly-Si film and the $SiO_2$ film equal to 40 or greater.

An etching device 5B of FIG. 4 has the same configuration as that of the etching device 5A illustrated in FIG. 3, except that the first gas excitation part 63a is not provided and the F-containing gas supply source 66 is directly coupled to the first gas supply pipe 62a. In this configuration, the F-containing gas supplied from the F-containing gas supply source 66 is introduced, without being excited, into the chamber 40 through the first gas supply pipe 62a and the first gas introduction nozzle 61a. Like the second embodiment, the $O_2$ gas, while being excited by the second gas excitation part 63b, is introduced into the chamber 40 through the second gas supply pipe 62b and the second gas introduction nozzle 61b.

In the third embodiment of FIG. 4, the F-containing gas is supplied into the chamber 40, without being excited. The F-containing gas has a high reactivity, which makes it possible to etch the SiN film at a high etching rate in a state where the F-containing gas coexists with the excited $O_2$ gas. In particular, when the $F_2$ gas is used as the F-containing gas, since the $F_2$ gas has a very high reactivity, it is possible to obtain the same etching rate as that of the etching device 5 of FIG. 2 without converting the $F_2$ gas to plasma. Also, like the etching devices 5 and 5A of FIGS. 2 and 3, it is possible to decrease an etching rate of the poly-Si film and the $SiO_2$ film based on the F-containing gas and the $O_2$ gas, thus etching the SiN film with respect to the poly-Si film and the $SiO_2$ film with high selectivity. Further, when the $SiO_2$ film is used as an underlayer, it is possible to etch the SiN film without causing damage such as roughness to the $SiO_2$ film.

As described above, according to some embodiments of the present disclosure, the etching device 5, 5A or 5B supplies the F-containing gas and the $O_2$ gas, while exciting at least the $O_2$ gas, onto the SiN film formed on the surface of the wafer W such that the SiN film is etched. With this configuration, it is possible to etch the SiN film at a high etching rate, and further, etch the SiN film with respect to at least one of the $SiO_2$ film and the poly-Si film with high selectivity.

<Another Processing System>

Figure 5:
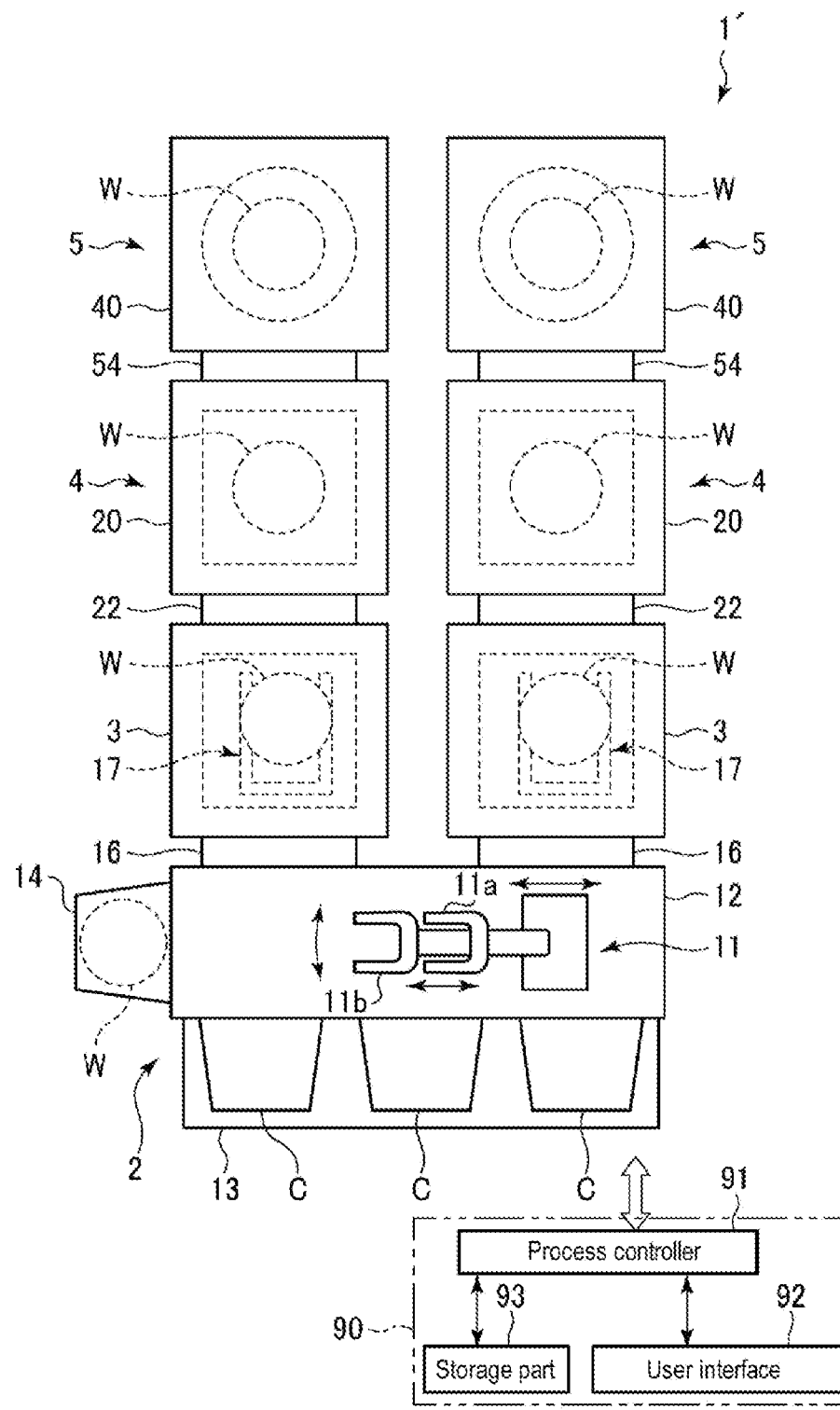
FIG. 5 is a schematic configuration view illustrating another example of a processing system including an etching device which is used to perform an etching method according to an embodiment of the present disclosure.

Next, a processing system according to another embodiment of the present disclosure will be described. A large amount of etching residue may remain according to etching conditions applied in an etching device. In such a case, in some embodiments, a heat treatment device configured to heat the wafer W after the etching process and remove the etching residue may be provided in the processing system. FIG. 5 is a schematic configuration view illustrating a processing system 1' equipped with such a heat treatment device. The processing system 1' is different from the processing system 1, in that two heat treatment devices 4 are installed between the load lock chambers 3 and the etching devices 5. In the processing system 1', the second wafer transfer mechanism 17 of the load lock chamber 3 is configured to access both the etching device 5 and the heat treatment device 4. With this configuration, the wafer W which has been subjected to the etching process in the etching device 5, can be transferred to the heat treatment device 4 where the wafer W is subjected to a heat treatment for removing the etching residue.

Figure 6:
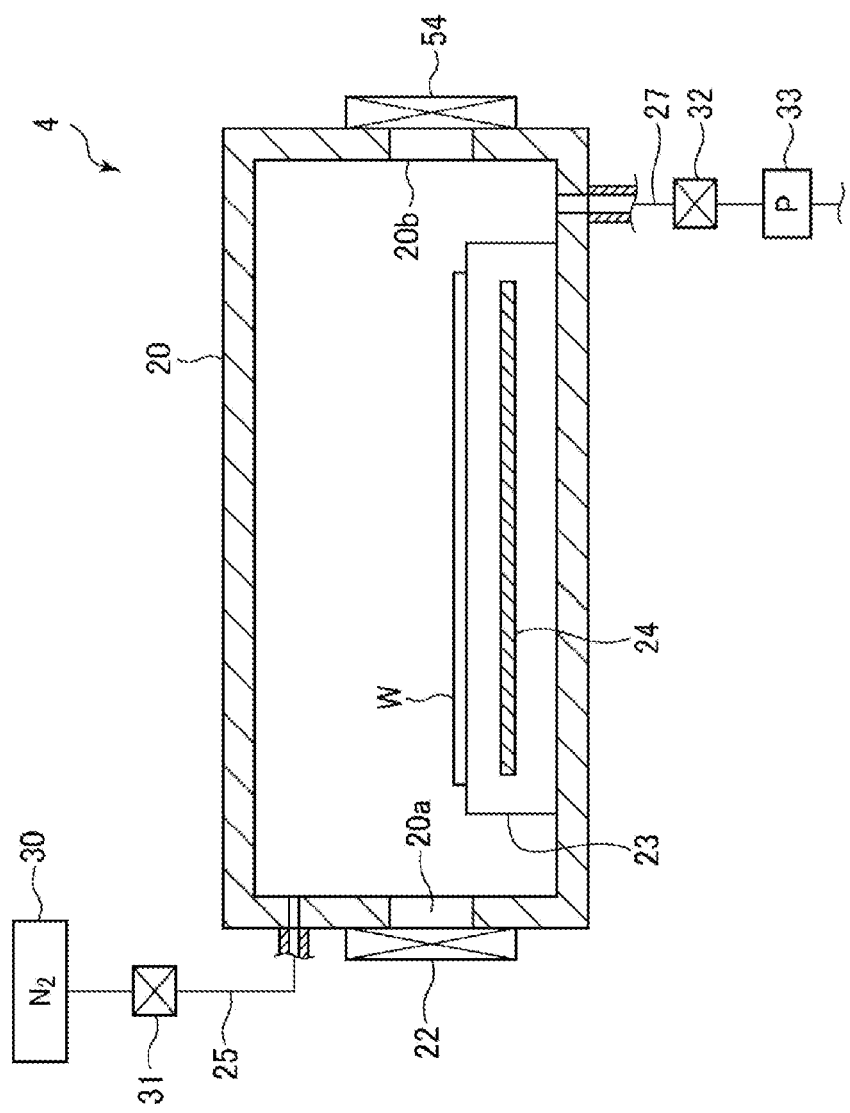
FIG. 6 is a cross-sectional view illustrating a configuration of a heat treatment device included in the processing system of FIG. 5.

As illustrated in FIG. 6, each of the heat treatment devices 4 includes a vacuum-evacuable chamber 20 and a mounting table 23 configured to mount the wafer W thereon within the chamber 20. A heater 24 is embedded in the mounting table 23. After being subjected to the etching process, the wafer W is heated by the heater 24, thereby vaporizing and removing the etching residues which exist on the wafer W. A loading/unloading gate 20a through which the wafer W is transferred between the heat treatment device 4 and the load lock chamber 3, is installed in one sidewall of the chamber 20 adjoining the load lock chamber 3. The loading/unloading gate 20a is opened and closed by the gate valve 22. In addition, a loading/unloading gate 20b through which the wafer W is transferred between the heat treatment device 4 and the etching device 5, is installed in another sidewall of the chamber 20 adjoining the etching device 5. The loading/unloading gate 20b is opened and closed by the gate valve 54. A gas supply path 25 is connected to an upper portion of the sidewall of the chamber 20. The gas supply path 25 is coupled to an $N_2$ gas supply source 30. An exhaust path 27 is connected to the bottom wall of the chamber 20. The exhaust path 27 is coupled to a vacuum pump 33. A flow rate adjusting valve 31 is installed in the gas supply path 25. A pressure adjusting valve 32 is installed in the exhaust path 27. By controlling the flow rate adjusting valve 31 and the pressure adjusting valve 32, the interior of the chamber 20 is kept in a $N_2$ gas atmosphere having a predetermined pressure. Inert gases other than the $N_2$ gas may be used.

EXPERIMENTAL EXAMPLES

Next, experimental examples will be described.

First Experimental Example

In this experimental example, a first sample in which a thermal oxide ($SiO_2$) film having a thickness of 100 nm is formed on a silicon substrate, a second sample in which a thermal oxide ($SiO_2$) film having a thickness of 100 nm followed by a poly-Si film having a thickness ranging from about 150 to 200 nm is formed on a silicon substrate, and a third sample in which a thermal oxide ($SiO_2$) film having a thickness of 100 nm followed by an SiN film having a thickness ranging from about 200 to 300 nm is formed on a silicon substrate, were prepared. Wherein, the SiN film is formed of dichlorosilane (DCS; $SiCl_2H_2$) as a raw material by CVD. An etching process was performed with respect to these samples under conditions that an $F_2$ gas diluted with an $N_2$ gas is used as an F-containing gas, a flow rate ratio of an $O_2$ gas to the $F_2$ gas (i.e., a volume ratio of $O_2/F_2$) is changed between 0 to 9, and these gases are introduced into a chamber while being excited by plasma. Other conditions applied in the etching process were as follows:

Internal pressure of chamber: 0.1 Torr (13.33 Pa) to 10 Torr (1333 Pa),

Temperature of mounting table: 10 to 200 degrees C.,

Period of etching time: 30 to 1800 sec,

Flow rate of $F_2$ gas: 1 to 1000 sccm (as an equivalent value),

Flow rate of $O_2$ gas: 0 to 5000 sccm,

Flow rate of $N_2$ gas: 0.2 to 2000 sccm (as an equivalent value), and

Power of gas excitation part: 400 W.

Figure 7:
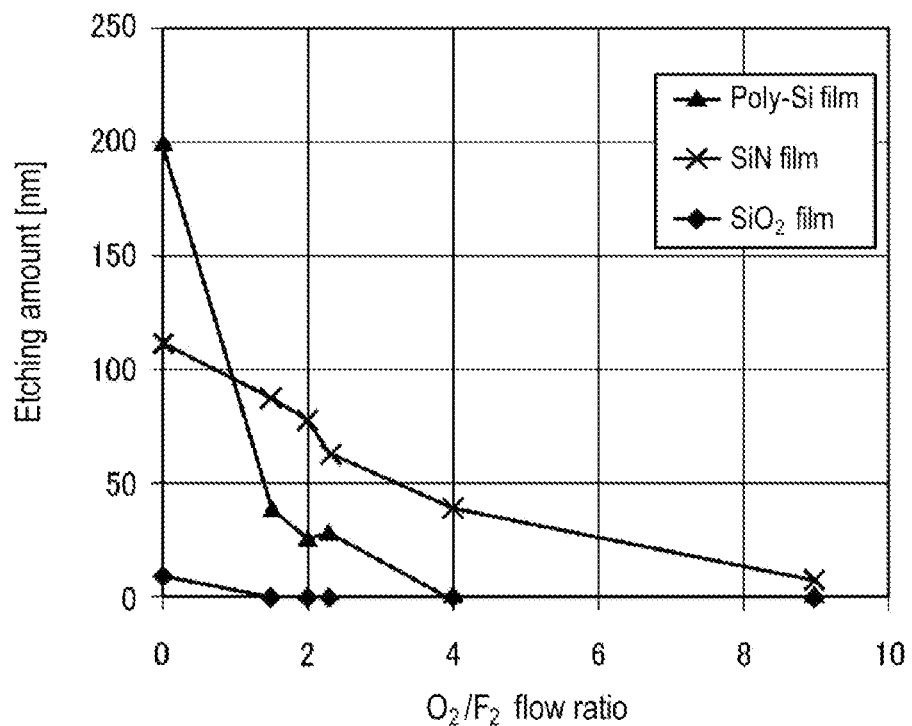
FIG. 7 is a view illustrating a relationship between a flow rate ratio ($O_2/F_2$) of an $O_2$ gas to an $F_2$ gas and an etching amount of each of an SiN film, a poly-Si film and an $SiO_2$ film, when the $F_2$ gas diluted with an $N_2$ gas was is used as an F-containing gas.

The experiment results are illustrated in FIG. 7. FIG. 7 illustrates a relationship between a flow rate ratio and an etching amount of each of an SiN film, a poly-Si film and an $SiO_2$ film, with the flow rate ratio (a value of $O_2/F_2$) as a horizontal axis and the etching amount as a vertical axis. As illustrated in FIG. 7, when the value of $O_2/F_2$ is zero, i.e., when the $F_2$ gas alone was used in the etching process, the etching amount of the SiN film was at a high level, thus etching the SiN film at a high etching rate. However, the etching amount of the poly-Si film was at a higher level than that of the SiN film and the $SiO_2$ film was also etched by a considerable amount. Therefore, an etching selectivity of the SiN film with respect to the poly-Si film and the $SiO_2$ film was insufficient. In contrast, as the $O_2$ gas increases, the etching rate of the SiN film was lowered and the etching rates of the poly-Si film and the $SiO_2$ film were also lowered. Therefore, this experiment shows that there is a tendency to increase the etching selectivity of the SiN film with respect to the poly-Si film and the $SiO_2$ film. Further, when the value of $O_2/F_2$ is 4, an etching selectivity (SiN/poly-Si) of the SiN film to the poly-Si film was at a high level of 500 or greater and an etching selectivity (SiN/$SiO_2$) of the SiN film to the $SiO_2$ film was at a high level of 30 or greater. When the value of $O_2/F_2$ exceeds 4, the etching amount of the SiN film was further lowered, but the etching amount of the poly-Si film or the $SiO_2$ film was almost zero. Thus, the etching selectivity was not significantly lowered. From these results, it was confirmed that when the value of $O_2/F_2$ is 4, the etching amount and the etching selectivity of the SiN film was in an optimally balanced relationship. Further, it was confirmed that, even though the etching amount of the SiN film is further lowered as the value of $O_2/F_2$ exceeds 4, the etching selectivity of the SiN film was not greatly lowered, thus obtaining relatively desirable results.

Second Experimental Example

Next, a sample in which a thermal oxide ($SiO_2$) film having a thickness of 100 nm is formed on a silicon substrate and subsequently, an SiN film having a thickness of 6 nm formed of dichlorosilane (DCS; $SiCl_2H_2$) as a raw material is formed on the $SiO_2$ film, was prepared. The sample was subjected to the etching process under the same conditions as the first experimental example, except that a flow rate ratio of $O_2/F_2$ is 4. The conditions at this time are defined as a sufficient over-etching condition for the SiN film when viewed from the results of the first experimental example. As a result, the SiN film was completely etched so that the $SiO_2$ film used as an underlayer was exposed, but the surface of the $SiO_2$ film was not damaged.

Third Experimental Example

In this experimental example, an etching process was performed on the same samples as those of the first experimental example under conditions that a temperature of the mounting table is changed, and the $F_2$ gas and the $O_2$ gas are introduced into the chamber, while being excited by plasma. Other conditions applied in this etching process were as follows:
 Internal pressure of chamber: 0.1 Torr (13.33 Pa) to 10 Torr (1,333 Pa),
 Value of $O_2/F_2$: 19.5,
 Period of etching time: 30 to 1800 secs,
 Flow rate of $F_2$ gas: 1 to 1000 sccm (as an equivalent value),
 Flow rate of $O_2$ gas: 0 to 5000 sccm,
 Flow rate of $N_2$ gas: 0.2 to 2000 sccm (as an equivalent value), and
 Power of gas excitation part: 400 W.

Figure 8:
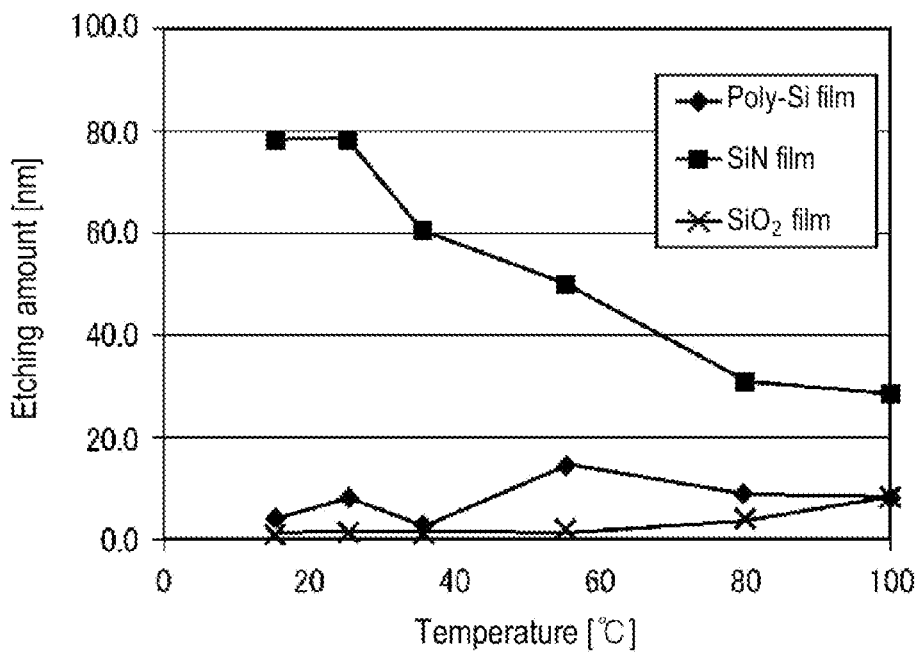
FIG. 8 is a view illustrating a relationship between a temperature of a mounting table and an etching amount of each of an SiN film, a poly-Si film and an $SiO_2$ film, when the $F_2$ gas diluted with an $N_2$ gas is used as an F-containing gas.

The experiment results are illustrated in FIG. 8. FIG. 8 illustrates a relationship between a temperature of a mounting table and an etching amount of each of an SiN film, a poly-Si film and an $SiO_2$ film, with the temperature as the horizontal axis and the etching amount as the vertical axis. As illustrated in FIG. 8, this experiment shows that the etching amount of the SiN film is increased with a decrease in the temperature of the mounting table, thus increasing the etching selectivity of the SiN film with respect to the poly-Si film and the $SiO_2$ film. In particular, when the temperature ranges from 10 to 100 degrees C., especially, from 15 to 55 degrees C., the optimal etching selectivity of the SiN film was obtained.

Fourth Experimental Example

In this experimental example, an etching process was performed on the same samples as those of the first experimental example under conditions that a temperature of the mounting table is changed, and the $F_2$ gas and the $O_2$ gas are introduced into the chamber, while being excited by plasma. Other conditions applied in this etching process were as follows:
 Temperature of mounting table: 35 degrees C.,
 Value of $O_2/F_2$: 19.5,
 Period of etching time: 30 to 1,800 sec,
 Flow rate of $F_2$ gas: 1 to 1,000 sccm (as an equivalent value),
 Flow rate of $O_2$ gas: 0 to 5,000 sccm, and
 Power of gas excitation part: 400 W.

Figure 9:
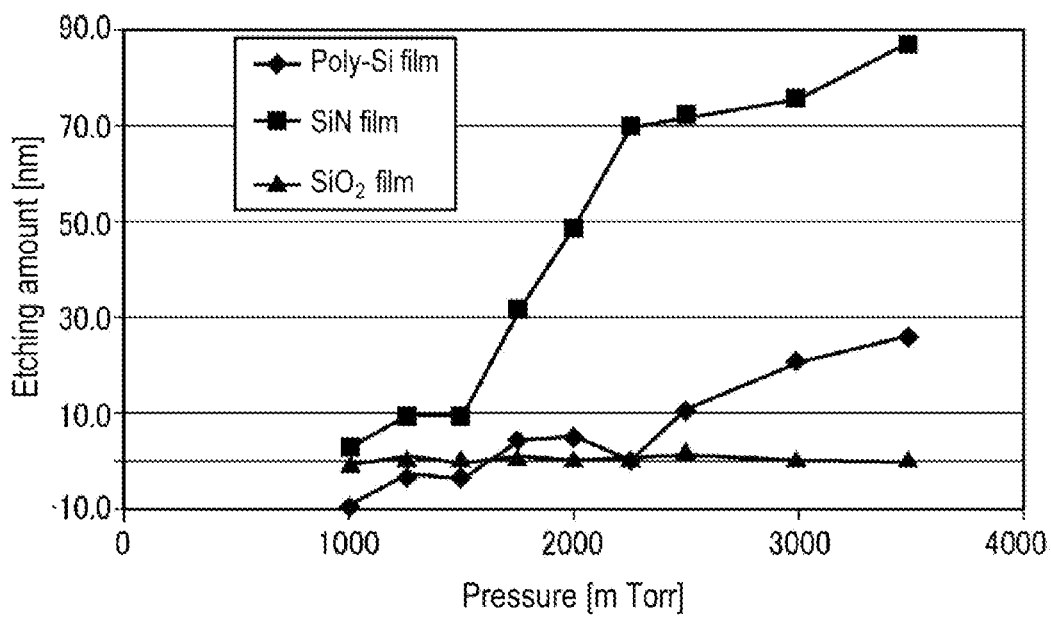
FIG. 9 is a view illustrating a relationship between an internal pressure of a chamber and an etching amount of each of an SiN film, a poly-Si film and an $SiO_2$ film, when the $F_2$ gas diluted with an $N_2$ gas is used as an F-containing gas.

The experiment results are illustrated in FIG. 9. FIG. 9 illustrates a relationship between an internal process of a chamber and an etching amount of each of an SiN film, a poly-Si film and an $SiO_2$ film, with the internal process as a horizontal axis and the etching amount as a vertical axis. As illustrated in FIG. 9, this experiment shows that the etching amount of the SiN film is increased with a decrease in the internal process. In particular, when the internal pressure ranges from 1,500 to 2,500 mTorr (200 to 333 Pa), the etching amount of the SiN film was sharply increased. Meanwhile, when the internal pressure exceeds 2,500 mTorr, the etching amount of the poly-Si film was also increased. Thus, it was confirmed that the optimal internal pressure of the chamber falls within a range from 500 to 5,000 mTorr, especially, from 1,000 to 2,500 mTorr.

Fifth Experimental Example

In this experimental example, a first sample in which a thermal oxide ($SiO_2$) film having a thickness of 100 nm is formed on a silicon substrate, a second sample in which a thermal oxide ($SiO_2$) film having a thickness of 100 nm followed by a poly-Si film having a thickness ranging from about 150 to 200 nm is formed on a silicon substrate, and a third sample in which a thermal oxide ($SiO_2$) film having a thickness of 100 nm followed by an SiN film having a thickness ranging from about 200 to 300 nm is formed on a silicon substrate, were prepared. Wherein, the SiN film is formed of dichlorosilane (DCS; $SiCl_2H_2$) as a raw material by CVD. An etching process was performed with respect to these samples under conditions that a flow rate ratio of an $O_2$ gas to a $ClF_3$ gas (i.e., a volume ratio of $O_2/ClF_3$) used as an F-containing gas is changed, and the $O_2$ gas and the $ClF_3$ gas are introduced into a chamber, while being excited by plasma. Other conditions applied in this etching process were as follows:
 Internal pressure of chamber: 0.5 Torr to 3 Torr,
 Temperature of mounting table: 15 to 60 degrees C.,
 Period of etching time: 300 sec,
 Flow rate of $ClF_3$ gas: 1 to 100 sccm,
 Flow rate of $O_2$ gas: 100 to 2,000 sccm,
 Flow rate of $N_2$ gas: 0 to 500 sccm, and
 Power of gas excitation part: 400 W.

Figure 10:
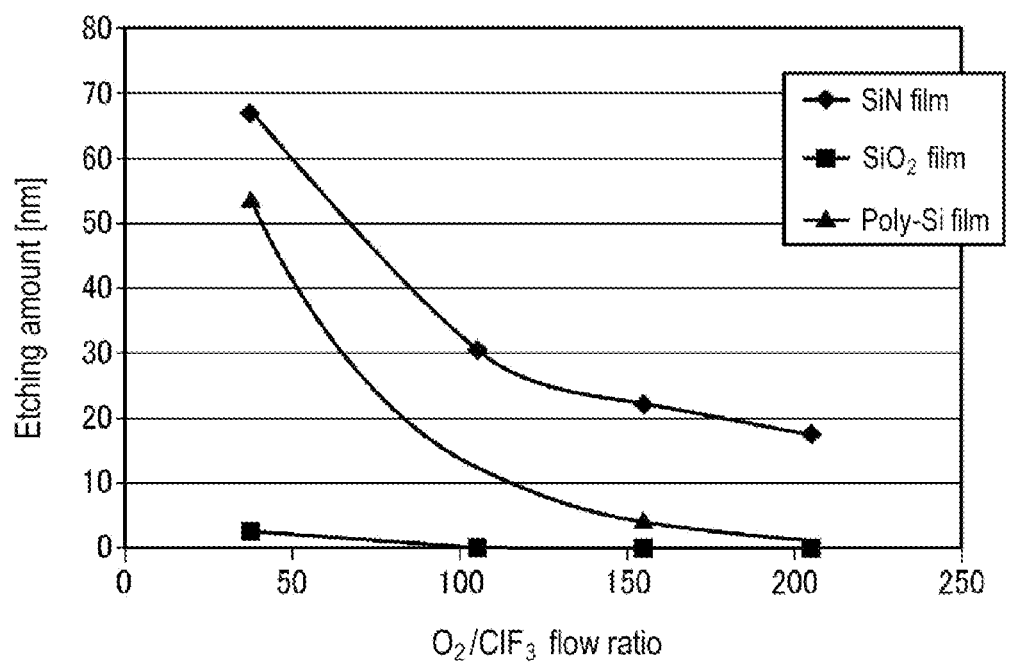
FIG. 10 is a view illustrating a relationship between a flow rate ratio ($O_2/ClF_3$) of an $O_2$ gas to a $ClF_3$ gas and an etching amount of each of an SiN film, a poly-Si film and an $SiO_2$ film, when the $ClF_3$ gas is used as an F-containing gas.
Figure 11:
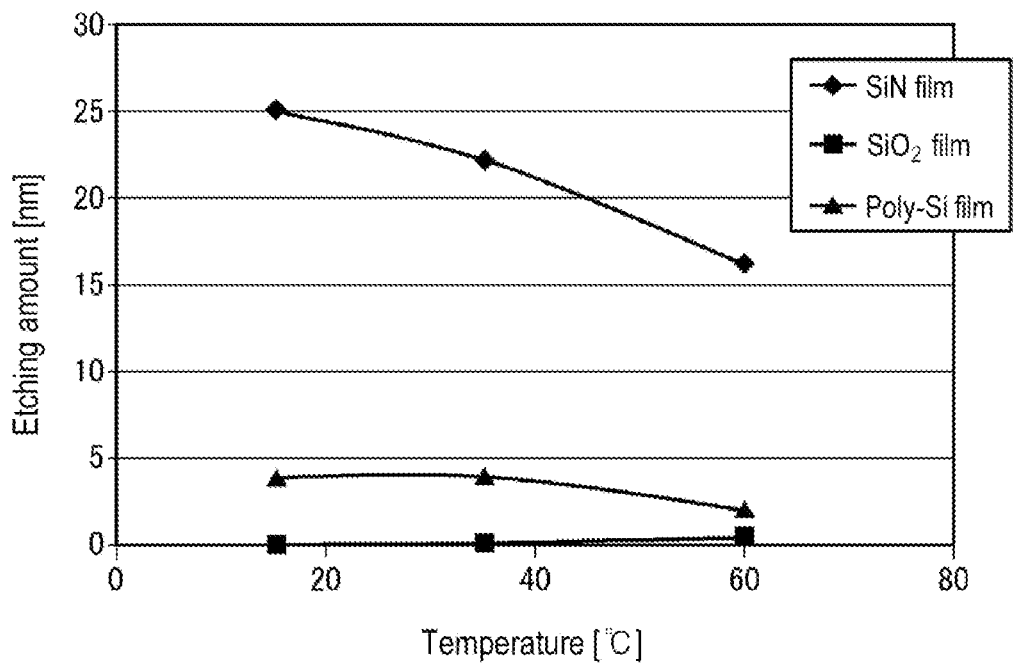
FIG. 11 is a view illustrating a relationship between a temperature of a mounting table and an etching amount of each of an SiN film, a poly-Si film and an $SiO_2$ film, when the $ClF_3$ gas is used as an F-containing gas.
Figure 12:
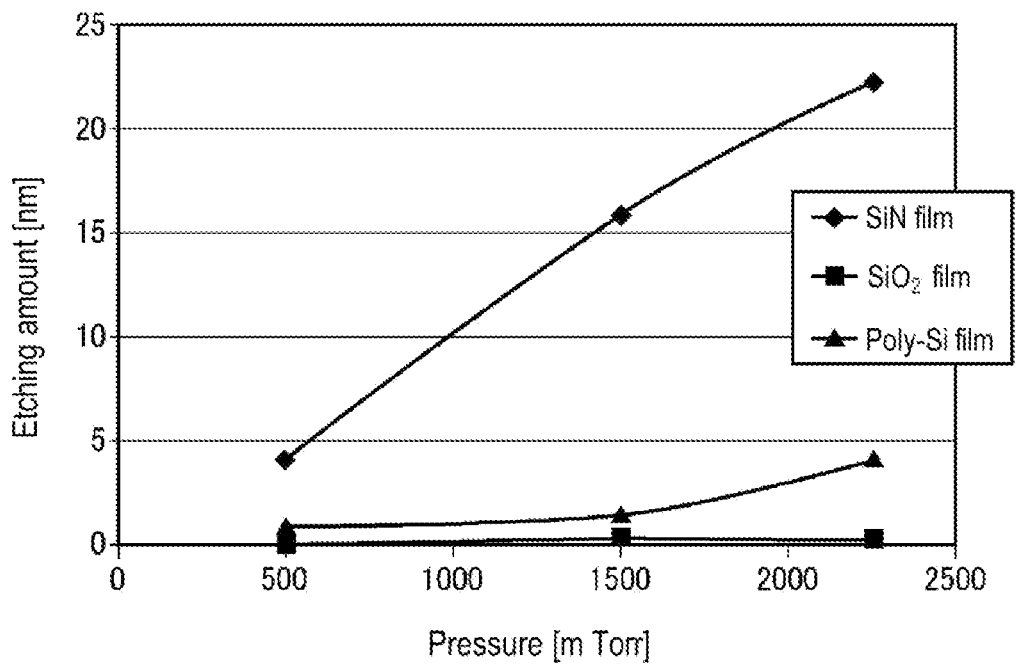
FIG. 12 is a view illustrating a relationship between an internal pressure of a chamber and an etching amount of each of an SiN film, a poly-Si film and an $SiO_2$ film, when the $ClF_3$ gas is used as an F-containing gas.

The experiment results are illustrated in FIGS. 10 to 12. FIG. 10 is a view illustrating a relationship between a flow rate ratio of an $O_2$ gas to a $ClF_3$ gas (i.e., a value of $O_2/ClF_3$) and an etching amount of each of an SiN film, a poly-Si film and an $SiO_2$ film. FIG. 11 is a view illustrating a relationship between a temperature of a mounting table and an etching amount of each of the SiN film, the poly-Si film and the $SiO_2$ film. FIG. 12 is a view illustrating a relationship between an internal pressure of a chamber and an etching amount of each of the SiN film, the poly-Si film and the $SiO_2$ film.

As illustrated in FIG. 10, there is a tendency that, when the value of $O_2/ClF_3$ is low, an etching rate of the SiN film is at a high level and an etching rate of the poly-Si film is also at a high level, which results in a lowered etching selectivity of the SiN film with respect to the poly-Si film. When the value of $O_2/ClF_3$ is 100 or greater, the etching selectivity of the SiN film with respect to the poly-Si film was further increased. An etching rate of the $SiO_2$ film was maintained at a low level, regardless of the value of $O_2/ClF_3$.

As illustrated in FIG. 11, this experiment shows that the etching amount of the SiN film is increased with a decrease in the temperature of the mounting table, which results in an increased etching selectivity of the SiN film with respect to the poly-Si film and the $SiO_2$ film. Specifically, it was confirmed that, when the temperature ranges from 15 to 60 degrees C., the etching rate of the SiN film is at a high level and the etching selectivity of the SiN film with respect to the poly-Si film is also at a high level.

As illustrated in FIG. 12, this experiment shows that the etching amount of the SiN film is increased with an increase in the internal process of the chamber. Specifically, it was confirmed that, when the internal pressure is 1,000 mTorr (133 Pa) or higher, the etching amount of the SiN film and the etching selectivity of the SiN film with respect to the poly-Si film and the SiO$_2$ film are further increased.

Sixth Experimental Example

This experimental example was performed to check the effect of the pre-oxidation process. An etching process was performed with respect to the same samples as those of the fifth experimental example under conditions that the pre-oxidation process is performed by changing a period of process time between 75 sec and 135 sec and changing a pressure between 2.25 Torr (3,000 Pa) and 3 Torr (4,000 Pa), and subsequently, the ClF$_3$ gas used as the F-containing gas and the O$_2$ gas are introduced into a chamber while being excited by plasma. Other conditions applied in the pre-oxidation process were that the temperature of the mounting table is 35 degrees C. and a power of a gas excitation part is 400 W. Other conditions applied in the etching process were as follows:

Internal pressure of chamber: 0.1 to 10 Torr,
Temperature of mounting table: 35 degrees C.,
Period of etching time: 300 sec,
Flow rate of ClF$_3$ gas: 1 to 20 sccm,
Flow rate of O$_2$ gas: 1,000 to 2,000 sccm,
Flow rate of N$_2$ gas: 0 to 500 sccm, and
Power of gas excitation part: 400 W.

Figure 13:
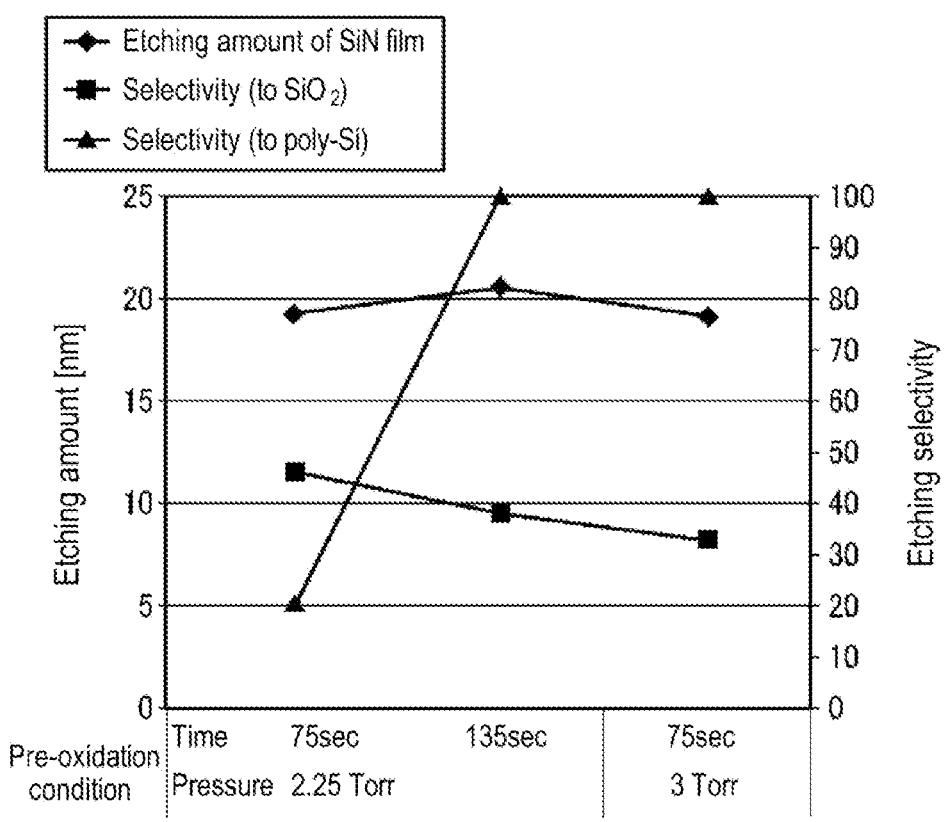
FIG. 13 is a view illustrating a relationship between conditions of a pre-oxidation process, an etching amount of an SiN film, and an etching selectivity of the SiN film with respect to a poly-Si film and an $SiO_2$ film, when the $ClF_3$ gas is used as an F-containing gas.

The experiment results are illustrated in FIG. 13. FIG. 13 is a view illustrating a relationship between the process conditions of the pre-oxidation process, an etching amount of an SiN film, and an etching selectivity of the SiN film with respect to the poly-Si film and the SiO$_2$ film. As illustrated in FIG. 13, this experiment shows that, as a period of time and a pressure of the pre-oxidation process are increased, the etching selectivity of the SiN film with respect to the poly-Si film is increased.

The above experimental examples show that, by supplying the F-containing gas and the O$_2$ gas which are excited within an appropriate range, it is possible to etch the SiN film with respect to the poly-Si film and the SiO$_2$ film with high selectivity, while maintaining a high etching rate. This makes it difficult for roughness on a surface of the SiO$_2$ film to occur. In addition, it can be seen that, since the pre-oxidation process is performed using the oxygen plasma before the etching process, the poly-Si film is hardly etched, thus increasing the etching selectivity of the SiN film with respect to the poly-Si film.

<Other Applications of the Present Disclosure>

The present disclosure is not limited to the aforementioned embodiments and may be differently modified. For example, the apparatuses of the aforementioned embodiments have been presented by way of example only. Indeed, the etching method according to the present disclosure may be implemented by apparatuses having different configurations. Furthermore, while there has been illustrated a case where the semiconductor wafer is used as a target substrate, the target substrate is not limited to the semiconductor wafer. The target substrate may be other substrates such as a flat panel display (FPD) substrate represented by a liquid crystal display (LCD) substrate, a ceramic substrate, and the like.

What is claimed is:

1. An etching method comprising:
    loading a target substrate into a chamber, the target substrate having a silicon nitride film and at least one of a polysilicon film and a silicon oxide film formed adjacent to the silicon nitride film;
    supplying a fluorine (F)-containing gas and an O$_2$ gas separately for the target substrate, while exciting at least the O$_2$ gas in a gas excitation part provided at a position adjacent to the chamber, the gas excitation part being separated from the chamber with a wall portion that defines the chamber; and
    selectively etching the silicon nitride film with respect to at least one of the polysilicon film and the silicon oxide film using the F-containing gas and the O$_2$ gas.

2. The method of claim 1, wherein supplying includes exciting a combination of the F-containing gas and the O$_2$ gas by plasma outside the chamber, and supplying them into the chamber.

3. The method of claim 1, wherein supplying includes separately exciting the F-containing gas and the O$_2$ gas by plasma outside the chamber.

4. The method of claim 1, wherein supplying includes supplying the F-containing gas, without exciting, into the chamber,
    wherein the O$_2$ gas, while being excited by plasma outside the chamber, is supplied into the chamber.

5. The method of claim 1, further comprising: before the etching, performing a pre-oxidation process which supplies an oxygen plasma to the target substrate such that a surface of the target substrate is oxidized.

6. The method of claim 1, wherein a temperature of a mounting table on which the target substrate is mounted within the chamber ranges from 10 to 200 degrees C. in the etching.

7. The method of claim 1, wherein an internal pressure of the chamber ranges from 13 to 1,333 Pa in the etching.

8. A non-transitory computer-readable recording medium storing a program that operates on a computer and causes the computer to control an etching device,
    wherein the program causes, when executed, the computer to control the etching device to perform the etching method of claim 1.

9. The method of claim 1, wherein supplying includes further supplying an inert gas.

10. The method of claim 9, wherein the inert gas is an N$_2$ gas or an Ar gas.

11. The method of claim 1, wherein the F-containing gas is an F$_2$ gas diluted with an inert gas.

12. The method of claim 11, wherein a volume ratio of the O$_2$ gas to the F$_2$ gas ranges from 1:2 to 1:1,000 in the etching.

13. The method of claim 1, wherein the F-containing gas is a ClF$_3$ gas.

14. The method of claim 13, wherein a volume ratio of the O$_2$ gas to the ClF$_3$ gas ranges from 1:4 to 1:1,000 in the etching.

15. The method of claim 1, wherein the excited gas is supplied for the target substrate through a hole formed in the wall portion.

16. The method of claim 15, wherein supplying includes further supplying an inert gas.

17. An etching method comprising:
    loading a target substrate into a chamber, the target substrate having a silicon nitride film and at least one of a polysilicon film and a silicon oxide film formed adjacent to the silicon nitride film;
    supplying a fluorine (F)-containing gas and an O$_2$ gas separately for the target substrate, while exciting at least the O$_2$ gas in a gas excitation part provided at a position adjacent to the chamber; and
    selectively etching the silicon nitride film with respect to at least one of the polysilicon film and the silicon oxide film using the F-containing gas and the O$_2$ gas, wherein supplying includes supplying the F-containing gas, without exciting, for the target substrate, and wherein the $O_2$ gas, while being excited by plasma outside the chamber, is supplied for the target substrate.

18. The method of claim 17, wherein supplying includes further supplying an inert gas.

19. The method of claim 17, further comprising: before the etching, performing a pre-oxidation process which supplies an oxygen plasma to the target substrate such that a surface of the target substrate is oxidized.

20. The method of claim 17, wherein the excited gas is supplied for the target substrate through a hole formed in a wall portion that defines the chamber.

* * * * *